(12) United States Patent
Choi

(10) Patent No.: US 8,969,110 B2
(45) Date of Patent: Mar. 3, 2015

(54) METHOD OF MANUFACTURING ORGANIC LIGHT-EMITTING DISPLAY APPARATUS

(71) Applicant: Samsung Display Co., Ltd., Yongin, Gyeonggi-Do (KR)

(72) Inventor: Jai-Hyuk Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/132,394

(22) Filed: Dec. 18, 2013

(65) Prior Publication Data

US 2015/0031152 A1 Jan. 29, 2015

(30) Foreign Application Priority Data

Jul. 25, 2013 (KR) ........................ 10-2013-0088175

(51) Int. Cl.
*H01L 21/00* (2006.01)
*H01L 51/56* (2006.01)
(52) U.S. Cl.
CPC ............. *H01L 51/56* (2013.01); *Y10S 438/958* (2013.01)
USPC ............... 438/26; 438/28; 438/783; 438/784; 438/958
(58) Field of Classification Search
USPC ............................. 438/26, 28, 783, 784, 958
See application file for complete search history.

(56) References Cited

U.S. PATENT DOCUMENTS

| 6,284,677 | B1 | 9/2001 | Hsiao et al. |
| 7,615,506 | B2 | 11/2009 | Aitken et al. |
| 2002/0019303 | A1* | 2/2002 | Yamanaka ...................... 501/17 |
| 2007/0252526 | A1 | 11/2007 | Aitken et al. |
| 2008/0226900 | A1* | 9/2008 | Nagai et al. ................... 428/333 |
| 2011/0256334 | A1* | 10/2011 | Edwards et al. ................ 428/69 |
| 2014/0120315 | A1* | 5/2014 | Aitken et al. .................. 428/142 |
| 2014/0144772 | A1* | 5/2014 | Bellman et al. .......... 204/192.15 |
| 2014/0151742 | A1* | 6/2014 | Logunov et al. ................ 257/99 |
| 2014/0234542 | A1* | 8/2014 | Aitken et al. .................. 427/294 |
| 2014/0291656 | A1* | 10/2014 | Gollier et al. ................... 257/40 |

FOREIGN PATENT DOCUMENTS

| KR | 1020100050470 A | 5/2010 |
| KR | 1020120067056 A | 6/2012 |

* cited by examiner

*Primary Examiner* — Asok K Sarkar
(74) *Attorney, Agent, or Firm* — Cantor Colburn LLP

(57) ABSTRACT

A method of manufacturing an organic light-emitting display apparatus includes: providing an organic light emission part on a substrate; providing a first inorganic layer including a first low temperature viscosity transition ("LVT") inorganic material on the substrate to cover the organic light emission part; and adding fluoride into the first inorganic layer using a fluorine group material such that the first inorganic layer is converted into a second inorganic layer comprising a second low temperature viscosity transition inorganic material.

20 Claims, 4 Drawing Sheets ary embodiments of the invention
METHOD OF MANUFACTURING ORGANIC LIGHT-EMITTING DISPLAY APPARATUS This application claims priority to Korean Patent Application No. 10-2013-0088175, filed on Jul. 25, 2013, and all the benefits accruing therefrom under 35 U.S.C. §119, the content of which in its entirety is herein incorporated by reference.

BACKGROUND

1. Field

One or more exemplary embodiments of the invention relate to a method of manufacturing an organic light-emitting display apparatus.

2. Description of the Related Art

An organic light-emitting display apparatus is a self-emission type display apparatus including an organic light-emitting device, which includes a hole injection electrode, an electron injection electrode and an organic light emission layer between the hole injection and electron injection electrodes, and emitting light when excitons drop from an excited state to a ground state, where the excitons are generated when holes injected from the hole injection electrode and electrons injected from the electron injection electrode are bonded in the organic light emission layer.

The organic light-emitting display apparatus, which is a self-emission type display apparatus, does not include a separate light source, such that the organic light-emitting display apparatus may be driven at a low voltage and may have a light-weight and a thin thickness. In addition, the organic light-emitting display apparatus typically has high-grade characteristics, such as a wide angle of view, high contrast, a quick response speed and the like.

In the organic light-emitting device, a sealing structure for sealing up the organic light-emitting device from an external environment, e.g., oxygen, humidity and the like, is typically provided.

SUMMARY

One or more exemplary embodiments of the invention include a method of manufacturing an organic light-emitting display apparatus having an improved sealing characteristic and a simple sealing process.

Additional features will be set forth in part in the description which follows and, in part, will be apparent from the description, or may be learned by practice of the presented embodiments.

According to one or more exemplary embodiments of the invention, a method of manufacturing an organic light-emitting display apparatus includes: providing an organic light emission part on a substrate; providing a first inorganic layer including a first low temperature viscosity transition ("LVT") inorganic material on the substrate to cover the organic light emission part; adding fluoride into the first inorganic layer using a fluorine group material such that the first inorganic layer is converted into a second inorganic layer comprising a second low temperature viscosity transition inorganic material.

In an exemplary embodiment, the adding fluoride into the first inorganic layer may include using a plasma processing process.

In an exemplary embodiment, the adding fluoride into the first inorganic layer may include using an ion injection process.

In an exemplary embodiment, the fluorine group material may include sulfur fluoride ($SF_6$), carbon fluoride ($CF_4$), or a combination thereof.

In an exemplary embodiment, the first LVT inorganic material may include a tin oxide.

In an exemplary embodiment, the first LVT inorganic material may include a tin oxide (SnO) and may further include a phosphorous oxide ($P_2O_5$), a boron phosphate ($BPO_4$), a niobium oxide (NbO), a zinc oxide (ZnO), a titanium oxide ($TiO_2$), a tungsten oxide ($W_3O$), or a combination thereof.

In an exemplary embodiment, a viscosity transition temperature of the second LVT inorganic material may be lower than a viscosity transition temperature of the first LVT inorganic material.

In an exemplary embodiment, the first inorganic layer may include tin phosphate glass ($SnO-P_2O_5$).

In an exemplary embodiment, the second inorganic layer may include tin fluoride phosphate glass ($SnO-P_2O_5-SnF_2$).

In an exemplary embodiment, the substrate may be a flexible substrate.

According to one or more exemplary embodiments of the invention, a method of manufacturing an organic light-emitting display apparatus includes: providing an organic light emission part on a substrate; providing a first inorganic layer including a first LVT inorganic material on the substrate to cover the organic light emission part; adding fluoride into the first inorganic layer using a fluorine group material such that the first inorganic layer is converted into a second inorganic layer comprising a second LVT inorganic material; and performing a healing operation on the second inorganic layer by heat-treating the second inorganic layer at a predetermined temperature equal to or higher than a viscosity transition temperature of the second LVT inorganic material such that the second inorganic layer is converted into a third inorganic layer.

In an exemplary embodiment, the second LVT inorganic material may be formed by doping fluoride into the first LVT inorganic material or substituting a portion of the first LVT inorganic material by fluoride.

In an exemplary embodiment, the predetermined temperature may be lower than a denaturalization temperature of a material of the organic light emission part.

In an exemplary embodiment, the healing operation may be performed under a vacuum atmosphere or an inert gas atmosphere.

In an exemplary embodiment, the first LVT inorganic material may include tin phosphate glass ($SnO-P_2O_5$).

In an exemplary embodiment, the third inorganic layer may include tin fluoride phosphate glass ($SnO-P_2O_5-SnF_2$).

In an exemplary embodiment, the adding fluoride into the first inorganic layer may include using a plasma processing process.

In an exemplary embodiment, the viscosity transition temperature of the second LVT inorganic material may be lower than a viscosity transition temperature of the first LVT inorganic material.

In an exemplary embodiment, the viscosity transition temperature of the second LVT inorganic material may be lower than a denaturalization temperature of a material included in the organic light emission part.

In an exemplary embodiment, the organic light emission part may include a plurality of organic light-emitting devices, where each of the organic light-emitting devices includes a first electrode, a second electrode, and an organic light emission layer disposed between the first electrode and the second electrode.

BRIEF DESCRIPTION OF THE DRAWINGS

The above and other features will become apparent by describing in detail exemplary embodiments thereof with reference to the attached drawings, in which.

DETAILED DESCRIPTION

Figure 1:
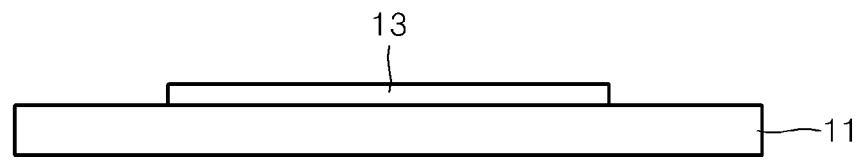
FIGS. 1 to 5B are schematic cross-sectional views illustrating an exemplary embodiment of a method of manufacturing an organic light-emitting display apparatus, according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 3:
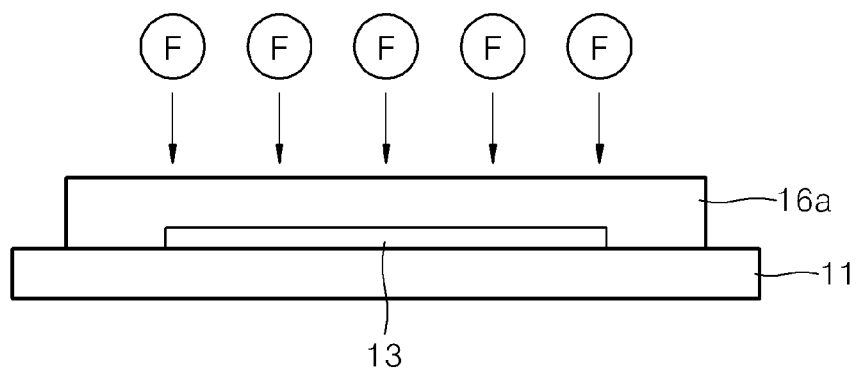
Figure 4:
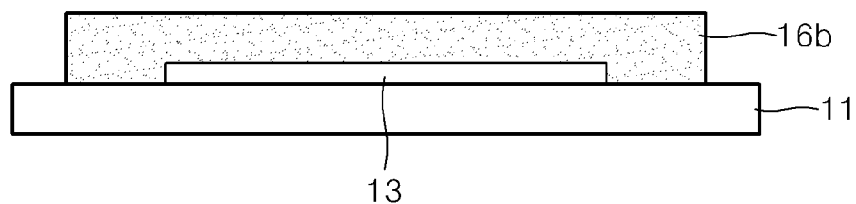
Figure 5A:
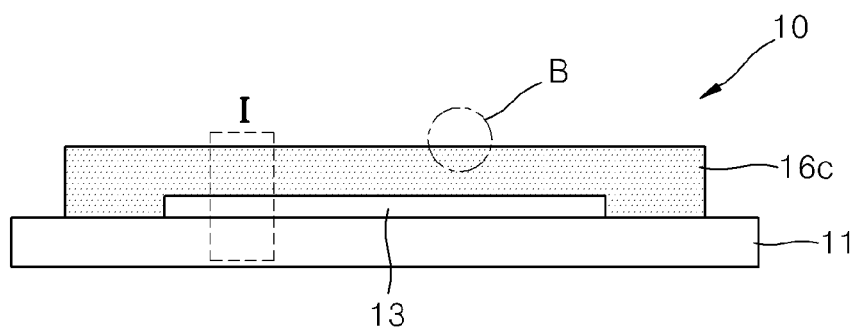
Figure 5B:
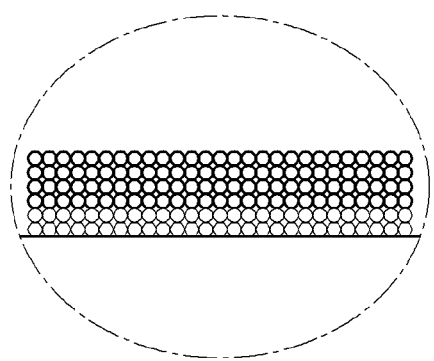
Figure 6:
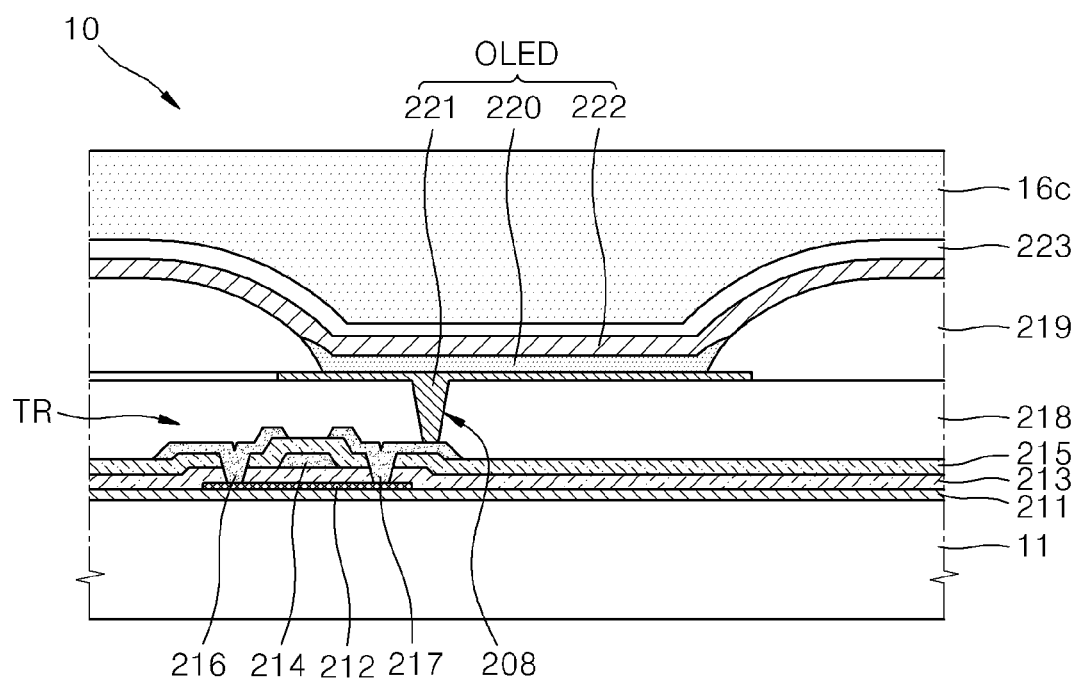
FIG. 6 is an enlarged cross-sectional view of a portion I of FIG. 5.

FIGS. 1 to 5A are schematic cross-sectional views illustrating an exemplary embodiment of a method of manufacturing an organic light-emitting display apparatus 10, according to the invention, and FIG. 6 is an enlarged cross-sectional view of a portion I of FIG. 5. FIGS. 2B and 5B are enlarged view of a portion A of FIG. 2A and a portion B of FIG. 5B, respectively.

Referring to FIG. 1, in an exemplary embodiment of a method of manufacturing an organic light-emitting display apparatus, an organic light emission part 13 is provided, e.g., formed, on a substrate 11.

In one exemplary embodiment, for example, the substrate 11 may be a glass-material substrate, but not being limited thereto. In an alternative exemplary embodiment, the substrate 11 may include a metal or a plastic. In such an embodiment, the substrate 11 may be a bendable flexible substrate.

The organic light emission part 13 is to display an image. In an exemplary embodiment, as shown in FIG. 6, the organic light emission part 13 includes an organic light-emitting device OLED having a structure in which a first electrode 221, an organic light emission layer 220 and a second electrode 222 are sequentially stacked on the substrate 11. In such an embodiment, the organic light emission part 13 may include a plurality of organic light-emitting devices OLED. The organic light emission part 13 will be described later in greater detail with reference to FIG. 6.

Figure 2A:
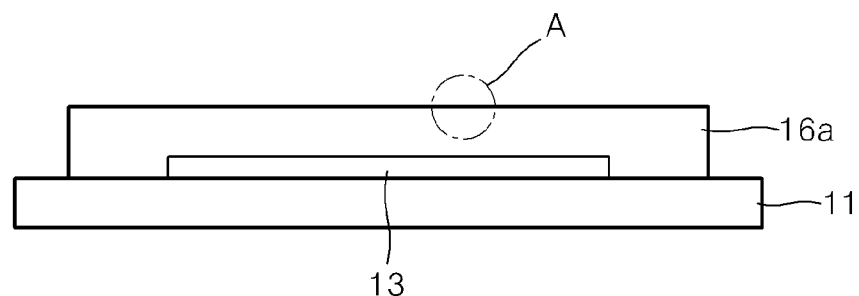
Figure 2B:
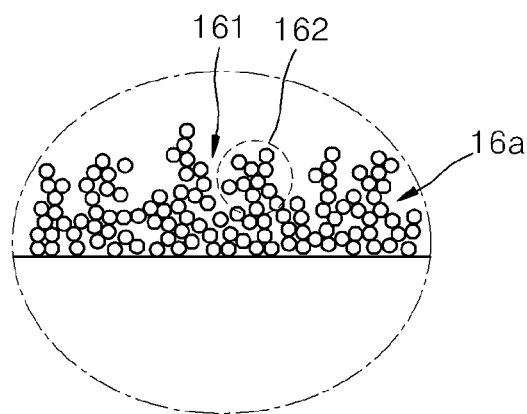

Referring to FIGS. 2A and 2B, a first inorganic layer 16a is provided, e.g., formed, on the organic light emission part 13. The first inorganic layer 16a substantially entirely covers the organic light emission part 13 such that the organic light emission part 13 is sealed by the first inorganic layer 16a and the substrate 11. The first inorganic layer 16a includes a first low temperature viscosity transition ("LVT") inorganic material. Herein, an LVT inorganic material means an inorganic material having a low viscosity transition temperature.

It will be understood that "viscosity transition temperature" as used herein does not indicate a temperature at which a viscosity of an LVT inorganic material is completely transited from "solid" to "liquid," but indicates a lowest temperature at which fluidity is provided to the LVT inorganic material.

As described below, an LVT inorganic material may be formed by being solidified after fluidified, and a viscosity transition temperature of the LVT inorganic material may be lower than a denaturalization temperature of a material included in the organic light emission part 13.

It will be understood that the "denaturalization temperature of a material included in the organic light emission part 13" as used herein indicates a temperature at which the chemical and/or physical denaturalization of a material included in the organic light emission part 13. For example, the "denaturalization temperature of a material included in the organic light emission part 13" may indicate a glass transition temperature Tg of an organic material included in the organic light emission layer 220 of the organic light emission part 13. The glass transition temperature Tg may be obtained from, for example, a result of performing a thermal analysis using a thermo gravimetric analysis ("TGA") or a differential scanning calorimetry ("DSC"), e.g., TGA or DSC under predetermined conditions such as $N_2$ atmosphere, temperature section (normal temperature to about 600° C. (10° C./min) for TGA, normal temperature to about 400° C. for DSC) and pan type (platinum (Pt) pan in single-use aluminum (Al) pan in TGA, single-use Al pan in DSC), for a material included in the organic light emission part 13 and may be easily recognized by those of ordinary skill in the art.

The denaturalization temperature of a material included in the organic light emission part 13 may exceed, for example, about 130° C., but is not limited thereto. As described above, the denaturalization temperature of a material included in the organic light emission part 13 may be easily measured through a TGA analysis, for example, for the material included in the organic light emission part 13.

According to one or more exemplary embodiments of the invention, a viscosity transition temperature of the first LVT inorganic material may be equal to or higher than about 80° C., for example, may be in a range of about 80° C. to about 130° C., but is not limited thereto. In one exemplary embodiment, for example, the viscosity transition temperature of the first LVT inorganic material may be in a range of about 80° C. to about 120° C., but is not limited thereto.

In an exemplary embodiment, the first LVT inorganic material may include a single compound or a combination (e.g., a mixture) of a plurality of compounds.

In an exemplary embodiment, the first LVT inorganic material may include a tin oxide (e.g., SnO or $SnO_2$).

In an exemplary embodiment, where the first LVT inorganic material includes SnO, an SnO content may be in a range of about 20 weight percent (wt %) to about 100 wt % based on a total weight of the first LVT inorganic material.

In one exemplary embodiment, for example, the first LVT inorganic material may further include a phosphorous oxide (e.g., $P_2O_5$), a boron phosphate ($BPO_4$), a tin fluoride (e.g., $SnF_2$), a niobium oxide (e.g., NbO), a tungsten oxide (e.g., $WO_3$), a zinc oxide (e.g., ZnO), a titanium oxide (e.g., $TiO_2$) or a combination thereof, but is not limited thereto. According to one or more exemplary embodiment of the invention, the first LVT inorganic material may include tin phosphate glass ($SnO$—$P_2O_5$).

In one exemplary embodiment, for example, the first LVT inorganic material may include: SnO; SnO and $P_2O_5$; SnO and $BPO_4$; SnO, $P_2O_5$ and NbO; or SnO, $P_2O_5$ and $WO_3$, but is not limited thereto.

In one exemplary embodiment, for example, the first LVT inorganic material may include a composition including SnO (about 100 wt %), SnO (about 80 wt %) and $P_2O_5$ (about 20 wt %), or SnO (about 90 wt %) and $BPO_4$ (about 10 wt %), but is not limited thereto. Herein, wt % is based on the total weight of the first LVT inorganic material.

In an exemplary embodiment, the thickness of the first inorganic layer 16a may be in a range of about 1 micrometer (μm) to about 30 μm. In one exemplary embodiment, for example, the thickness of the first inorganic layer 16a may be in a range of about 1 μm to about 5 μm. In such an embodiment, where the thickness of the first inorganic layer 16a satisfies about 1 μm to about 5 μm, the organic light-emitting display apparatus may be a flexible organic light-emitting display apparatus having a bending characteristic.

In an exemplary embodiment, the first inorganic layer 16a may be formed by resistive heating vapor deposition, sputtering, vacuum vapor deposition, low-temperature vapor deposition, electron beam coating, ion plating, or a combination thereof.

According to one or more exemplary embodiments of the invention, the first inorganic layer 16a may be formed by plasma chemical vapor deposition ("PCVD") or plasma ion assisted deposition ("PIAD"). According to one or more exemplary embodiments of the invention, the first inorganic layer 16a may be provided by sputtering an LVT inorganic material on the organic light emission part 13 in a dual rotary target method or a facing target method using a direct current ("DC") pulse power source. In an exemplary embodiment, the first inorganic layer 16a may be produced in a vacuum deposition process or an atmospheric deposition process using plasma.

According to one or more exemplary embodiments of the invention, when the first inorganic layer 16a is formed, a scanning method while moving the substrate 11 may be used. According to one or more exemplary embodiments of the invention, when the first inorganic layer 16a is deposited, a composition of an LVT material may be changed by adjusting an oxygen injection capacity.

In such an embodiment, as shown in FIG. 2B, the first inorganic layer 16a may include defects, such as an LVT inorganic material deposition element 162 and a pinhole 161. The LVT inorganic material deposition element 162 indicates a particle in which an LVT inorganic material that has not contributed to deposition of the LVT inorganic materials has cohered, and the pinhole 161 indicates a vacant region with no LVT inorganic material therein. The occurrence of the LVT inorganic material deposition element 162 may contribute to the occurrence of the pinhole 161.

Referring to FIGS. 3 and 4, a second inorganic layer 16b is provided, e.g., formed, by doping fluoride into the first inorganic layer 16a.

In an exemplary embodiment, of the substrate 11 including the first inorganic layer 16a thereon shown in FIG. 3 is inserted into a plasma chamber, in which a fluorine group material is in a plasma state, and then a plasma fluorination process may be performed. In such an embodiment, a fluoride may exist as a fluorine atom (F), a fluorine ion (F+ or F−), or a metastable fluorine atom (F*). According to one or more exemplary embodiments of the invention, the fluorine group material may include at least one of sulfur fluoride ($SF_6$) and carbon fluoride ($CF_4$). In one exemplary embodiment, for example, the fluorine group material may include $SF_6$, $CF_4$, or a combination thereof. According to one or more exemplary embodiments of the invention, the fluorine group material may be used together with an inert gas, such as argon (Ar).

In an alternative exemplary embodiment, an ion injection process of injecting fluorine ions into the first inorganic layer 16a may be performed.

Such a fluoride treatment process may be performed in a toll-to-roll process in an exemplary embodiment where the substrate 11 is a flexible substrate.

In such a process, the pinhole 161 of the first inorganic layer 16a may provide a path through which fluoride substantially deeply infiltrates inside the first inorganic layer 16a. Accordingly, the first LVT inorganic material included in the first inorganic layer 16a may be converted into a second LVT inorganic material including fluoride. In such an embodiment, the second LVT inorganic material may be fluoride-doped or fluoride-substituted, that is, the second LVT inorganic material is formed by doping fluoride into the first LVT inorganic material or substituting a portion of the first LVT inorganic material by fluoride. In such an embodiment, the second LVT inorganic material may be formed as the composition described with respect to the first LVT inorganic material is further doped with fluoride. According to one or more exemplary embodiments of the invention, the second inorganic layer 16b may include tin fluoride phosphate glass ($SnO$—$P_2O_5$—$SnF_2$).

In one exemplary embodiment, for example, the second LVT inorganic material may include: SnO and $SnF_2$; SnO, $SnF_2$ and $P_2O_5$; SnO, $SnF_2$ and $BPO_4$; SnO, $SnF_2$, $P_2O_5$ and NbO; or SnO, $SnF_2$, $P_2O_5$ and $WO_3$, but is not limited thereto.

A viscosity transition temperature of the second LVT inorganic material may be lower than a viscosity transition temperature of the first LVT inorganic material.

In general, an LVT inorganic material including fluoride has a lower viscosity transition temperature than an LVT inorganic material including no fluoride. When a viscosity transition temperature of an LVT inorganic material is low, the organic light emission part 13 may not be damaged when the organic light emission part 13 is sealed up with the LVT inorganic material.

Accordingly, when an LVT inorganic material including fluoride is formed in a vacuum deposition method, such as vapor deposition, sputtering, or the like, if a temperature increases during the deposition, uniform deposition may be effectively performed since a compound of the LVT inorganic material having a low melting point, such as $SnF_2$ or the like, is first melted.

Furthermore, when a sputtering target for an LVT inorganic material including fluoride is produced, sintering and the like may be performed at a high temperature, thereby melting down a compound of the LVT inorganic material, such as $SnF_2$ or the like.

In an exemplary embodiment, the second LVT inorganic material including fluoride may be produced in a plasma fluoride treatment process, such that a process of producing the second LVT inorganic material including fluoride may be simplified, and problems as described above may be solved.

Referring to FIG. 5A, a third inorganic material 16c is provided by a healing operation, e.g., by heat-treating the second inorganic layer 16b. In an alternative exemplary embodiment, the healing operation may be omitted.

The healing operation is performed at a temperature that is equal to or higher than the viscosity transition temperature of the second LVT inorganic material included in the second inorganic layer 16b. The healing operation may be performed at such a temperature at which the organic light emission part 13 is not damaged. In one exemplary embodiment, for example, the healing operation may be performed by heat-treating the second inorganic layer 16b at a temperature equal to or higher than the viscosity transition temperature of the second LVT inorganic material and lower than a denaturalization temperature of a material included in the organic light emission part 13. The "viscosity transition temperature of the second LVT inorganic material" varies according to a composition of the second LVT inorganic material, and the "denaturalization temperature of a material included in the organic light emission part 13" varies according to a material used in the organic light emission part 13, but it would be understood that the temperatures may be easily derived from a composition of the second LVT inorganic material and a component of a material used in the organic light emission part 13. In one exemplary embodiment, for example, the temperatures may be derived by evaluating a glass transition temperature Tg of an organic material obtained from a TGA result on a material included in the organic light emission part 13.

According to one or more exemplary embodiments of the invention, the healing operation may be performed by heat-treating the second inorganic layer 16b for about one hour to about three hours at a temperature in a range of about 80° C. to about 130° C. (e.g., for two hours at 100° C.), but is not limited thereto. When a temperature of the healing operation is in the range described above, the second LVT inorganic material included in the second inorganic layer 16b may be fluidized, and the denaturalization of the organic light emission part 13 may be effectively prevented.

According to one or more exemplary embodiments of the invention, the healing operation may be performed in an infrared ("IR") oven under a vacuum atmosphere or an inert gas atmosphere (e.g., an $N_2$ atmosphere, an Ar atmosphere, or the like).

The second inorganic layer 16b may still include defects, such as a deposition element (not shown) and a pinhole (not shown).

In the healing operation, the fluidized second LVT inorganic material may be filled in the pinhole of the second inorganic layer 16b, or the deposition element may be fluidized and filled in the pinhole. After the heat-treating, when a temperature decreases, the fluidized second LVT inorganic material is converted to a solid phase again.

As a result, as shown in FIG. 5B, the defects of the second inorganic layer 16b may be effectively removed, thereby providing the third inorganic material 16c having an elaborate film quality.

FIG. 6 is an enlarged cross-sectional view of a portion I of FIG. 5.

Referring to FIG. 6, an exemplary embodiment of the organic light-emitting display apparatus 10 may include the substrate 11, a buffer layer 211, a thin film transistor TR, an organic light-emitting device OLED, a pixel defining layer 219 and the third inorganic material 16c.

In one exemplary embodiment, for example, the substrate 11 may be a glass-material substrate, but is not limited thereto. In an alternative exemplary embodiment, the substrate 11 may be a metallic or plastic substrate. In an exemplary embodiment, the substrate 11 may be a bendable flexible substrate.

The buffer layer 211 may effectively prevent the diffusion of impurity ions on an upper surface of the substrate 11, effectively prevent the infiltration of humidity or the open air, and effectively planarize the surface thereof. According to one or more exemplary embodiments of the invention, the buffer layer 211 may include an inorganic material, such as a silicon oxide, a silicon nitride, a silicon oxynitride, an aluminum oxide, an aluminum nitride, a titanium oxide, a titanium nitride or the like, an organic material, such as polyimide, polyester, acryl or the like, or a combination thereof. In an alternative exemplary embodiment, the buffer layer 211 may be omitted.

The thin film transistor TR may include an active layer 212, a gate electrode 214, and source and drain electrodes 216 and 217. A gate insulating layer 213 is interposed between the active layer 212 and the gate electrode 214 for an insulation therebetween.

The active layer 212 may be provided on the buffer layer 211. The active layer 212 may include an inorganic semiconductor, such as amorphous silicon or poly silicon, or an organic semiconductor. According to one or more exemplary embodiments of the invention, the active layer 212 may include an oxide semiconductor. In one exemplary embodiment, for example, the oxide semiconductor may include a metallic element in Group 12, 13 or 14, such as zinc (Zn), indium (In), gallium (Ga), tin (Sn), cadmium (Cd), germanium (Ge) or hafnium (Hf), or an oxide thereof.

The gate insulating layer 213 is provided on the buffer layer 211 and covers the active layer 212, and the gate electrode 214 is provided on the gate insulating layer 213.

In such an embodiment, an interlayer insulating layer 215 may be provided on the gate insulating layer 213 to cover the gate electrode 214, and the source and drain electrodes 216 and 217 are provided on the interlayer insulating layer 215 and contact the active layer 212 through corresponding contact holes formed through the gate insulating layer 213 and the interlayer insulating layer 215.

In an exemplary embodiment, a structure of the thin film transistor TR is not limited to a specific structure, but may have various structures. In one exemplary embodiment, for example, the thin film transistor TR may have a top gate structure, as shown in FIG. 6. In an alternative exemplary embodiment, the thin film transistor TR may have a bottom-gate structure, in which the gate electrode 214 is disposed below the active layer 212.

A pixel circuit (not shown) including a capacitor together with the thin film transistor TR may be provided in the organic light-emitting display apparatus 10.

In an exemplary embodiment, a planarization layer 218 that covers the pixel circuit including the thin film transistor TR may be provided on the interlayer insulating layer 215. The planarization layer 218 may function to remove a level difference and planarize the pixel circuit to increase emission efficiency of the organic light-emitting device OLED provided thereon.

The planarization layer 218 may include an inorganic material and/or an organic material. In one exemplary embodiment, for example, the planarization layer 218 may include a photoresist, an acryl-group polymer, a polyimide-group polymer, a polyamide-group polymer, a siloxane-group polymer, a polymer including a photosensitive acrylic carboxyl base, a novolak resin, an alkali soluble resin, a silicon oxide, a silicon nitride, a silicon oxynitride, a silicon oxycarbonate, a silicon carbonitride, aluminum (Al), magnesium (Mg), Zn, Hf, zirconium (Zr), titanium (Ti), tantalum (Ta), an aluminum oxide, a titanium oxide, a tantalum oxide, a magnesium oxide, a zinc oxide, a hafnium oxide, a zirconium oxide, a titanium oxide, or a combination thereof.

The organic light-emitting device OLED is disposed on the planarization layer 218 and includes a first electrode 221, an organic light emission layer 220 and a second electrode 222. The pixel defining layer 219 is disposed on the planarization layer 218 and the first electrode 221 and defines a pixel area and a non-pixel area of the organic light-emitting display apparatus 10.

The organic light emission layer 220 may include a low-molecular organic material or a high-molecular organic material. In an exemplary embodiment, where the organic light emission layer 220 includes the low-molecular organic material, the organic light emission layer 220 may include a hole injection layer ("HIL"), a hole transport layer ("HTL"), an emission layer ("EML"), an electron transport layer ("ETL"), an electron injection layer ("EIL") or the like, which may be stacked on one another, each having a single layer structure or a complex structure, e.g., a multi-layer structure. The low-molecular organic materials may be provided using a vacuum deposition method. In such an embodiment, the EML may be independently provided for each of pixels of red ("R"), green ("G"), and blue ("B"), and the HIL, the HTL, the ETL, the EIL and the like, which are common layers of the pixels, may be commonly or simultaneously provided to the pixels of R, G and B.

In an exemplary embodiment, where the organic light emission layer 220 includes a high-molecular organic material, the organic light emission layer 220 may include only the HTL in a direction of the first electrode 221 based on the EML besides the EML. In one exemplary embodiment, for example, the HTL may be provided on the first electrode 221 in an inkjet printing or spin coating method using poly(3,4-ethylenedioxythiophene) ("PEDOT"), polyaniline ("PANI"), or the like. In such an embodiment, a high-molecular organic material may be poly-phenylene-vinylene ("PPV") group, polyfluorene group or the like, and a color pattern may be provided by, for example, inkjet printing, spin coating, thermal transfer using a laser or the like, the details of which can be determined by one of skill in the art without undue experimentation.

In an exemplary embodiment, the HIL may include a phthalocyanine compound, such as copper phthalocyanine ("CuPc") or the like, or any of starburst-type amines, such as 4,4',4''-tris(carbazol-9-yl)triphenylamine ("TCTA"), tris(N-3-methylphenyl-N-phenylamino)triphenylamine ("m-MTDATA"), 1,3,5-tris[4-(3-methylphenylphenylamino)phenyl]benzene ("m-MTDAPB") and the like.

In an alternative exemplary embodiment, the HTL may include N,N'-bis(3-methylphenyl)-N,N'-diphenyl-(1,1-biphenyl)-4,4'-diamine ("TPD"), N,N'-di(naphthalene-1-yl)-N,N'-diphenylbenzidine ("α-NPD"), or the like.

In an exemplary embodiment, the EIL may be provided using a material, such as lithium fluoride (LiF), sodium chloride (NaCl), cesium fluoride (CsF), lithium oxide ($Li_2O$), 8-hydroxyquinolate-lithium ("Liq"), or the like.

In an alternative exemplary embodiment, the ETL may be provided using tris(8-hydroxyquinolate) aluminum ("Alq$_3$.").

In an exemplary embodiment, the EML may include a host material and a dopant material.

In such an embodiment, the host material of the EML may include Alq$_3$, 9,10-di(naphthalen-2-yl)anthracene ("ADN"), 3-tert-butyl-9,10-di(naphthalen-2-yl)anthracene ("TBADN"), 4,4'-bis(2,2-diphenyl-ethen-1-yl)-4,4'-dimethylphenyl ("DPVBi"), 4,4'-bis(2,2-diphenyl-ethene-1-yl)-4, 4'-dimethylphenyl ("p-DMDPVBi"), tert(9,9-diarylfluorene)s ("TDAF"), 2-(9,9'-spirobifluorene-2-yl)-9,9'-spirobifluorene ("BSDF"), 2,7-bis(9,9'-spirobifluorene-2-yl)-9,9'-spirobifluorene ("TSDF"), bis(9,9-diarylfluorene)s ("BDAF"), 4,4'-bis(2,2-diphenyl-ethen-1-yl)-4,4'-di-(tert-butyl)phenyl ("p-TDPVBi"), 1,3-bis(carbazol-9-yl)benzene ("mCP"), 1,3,5-tris(carbazol-9-yl)benzene ("tCP"), TcTa, 4,4'-bis(carbazol-9-yl)biphenyl ("CBP"), 4,4'-bis(9-carbazolyl)-2,2'-dimethyl-biphenyl ("CBDP"), 4,4'-bis(carbazol-9-yl)-9,9-dimethyl-fluorene ("DMFL-CBP"), 4,4'-bis(carbazol-9-yl)-9,9-bis(9-phenyl-9H-carbazol)fluorene ("FL-4CBP"), 4,4'-bis(carbazol-9-yl)-9,9-di-tolyl-fluorene ("DPFL-CBP"), 9,9-bis(9-phenyl-9H-carbazol)fluorene ("FL-2CBP"), or the like, for example.

In such an embodiment, the dopant material of the EML may include 4,4'-bis[4-(di-p-tolylamino)styryl]biphenyl ("DPAVBi"), ADN, TBADN, or the like, for example.

The first electrode 221 is disposed on the planarization layer 218 and may be electrically connected to the drain electrode 217 of the thin film transistor TR through a through hole 208 defined through the planarization layer 218.

In an exemplary embodiment, the first electrode 221 may function as an anode, and the second electrode 222 may function as a cathode, but is not limited thereto. In an alternative exemplary embodiment, the first electrode 221 may function as a cathode, and the second electrode 222 may function as an anode in an alternative exemplary embodiment.

In an exemplary embodiment, where the first electrode 221 functions as an anode, the first electrode 221 may include an indium tin oxide ("ITO"), an indium zinc oxide ("IZO"), a zinc oxide ("ZnO"), an indium oxide (In$_2$O$_3$) or the like having a large work function. In an exemplary embodiment, where the organic light-emitting display apparatus 10 is a top emission type which displays an image in a direction opposite to the substrate 11, the first electrode 221 may further include a reflective layer including silver, (Ag), magnesium (Mg), Al, platinum (Pt), palladium (Pd), gold (Au), nickel (Ni), neodymium (Nd), iridium (Ir), chromium (Cr), Li, ytterbium (Yb), calcium (Ca) or the like, for example. The reflective layer may include a combination of the metals described above. The first electrode 221 may have a single-layer structure or a multi-layer structure including a metal and/or alloy described above. According to one or more exemplary embodiments of the invention, the first electrode 221 may include an ITO/Ag/ITO structure as a reflective electrode.

In an exemplary embodiment, where the second electrode 222 functions as a cathode, the second electrode 222 may include a metal, such as Ag, Mg, Al, Pt, Pd, Au, Ni, Nd, Ir, Cr, Li, or Ca, for example. In an exemplary embodiment, where the organic light-emitting display apparatus 10 is the top emission type, the second electrode 222 may be photo-transmissible. According to one or more exemplary embodiments of the invention, the second electrode 222 may include a transparent conductive metal oxide, such as ITO, IZO, a zinc tin oxide ("ZTO"), ZnO, In$_2$O$_3$, or the like, for example.

According to an exemplary embodiment of the invention, the second electrode 222 may include a thin film including Li, Ca, LiF/Ca, LiF/Al, Al, Ag, Mg, Yb, or a combination thereof. In one exemplary embodiment, for example, the second electrode 222 may be formed in a single-layer or multi-layer structure including Mg:Ag, Ag:Yb, and/or Ag. In an exemplary embodiment, the second electrode 222 provided for each pixel may be connected to each other such that a common voltage is applied to all pixels.

The pixel defining layer 219 has an aperture that exposes the first electrode 221, and defines the pixel area and the non-pixel area of the organic light-emitting device OLED. In such an embodiment, the pixel defining layer 219 may have a plurality of apertures corresponding to a plurality of pixel areas. The first electrode 221, the organic light emission layer 220 and the second electrode 222 are sequentially stacked in the aperture of the pixel defining layer 219 to thereby allow the organic light emission layer 220 to emit light. In such an embodiment, a portion in which the pixel defining layer 219 is provided is substantially the non-pixel area, and the aperture of the pixel defining layer 219 is substantially the pixel area.

In an exemplary embodiment including a plurality of apertures, the organic light-emitting display apparatus 10 may include a plurality of organic light-emitting devices OLED corresponding to a plurality of pixels or the pixel areas defined by the apertures. In such an embodiment, each of the organic light-emitting devices OLED may correspond to a pixel of the pixels, and a red, green, blue or white color may be displayed by each pixel.

In an alternative exemplary embodiment, the organic light-emitting display apparatus 10 may include a single organic light emission layer 220 provided to cover substantially an entire of a surface of the planarization layer 218 regardless of a position of each pixel. In such an embodiment, the organic light emission layer 220 may be provided by vertically stacking or mixing layers including emission materials that emit lights of red, green and blue or, a combination of other colors to emit white light. In such an embodiment, a color conversion layer or a color filter for converting the emitted white light to a predetermined color may be further included.

A protective layer 223 may be disposed on the organic light-emitting device OLED and the pixel defining layer 219 and may cover and protect the organic light-emitting device OLED. The protective layer 223 may include an inorganic insulating layer and/or an organic insulating layer. In such an embodiment, the inorganic insulating layer may include a silicon oxide (SiO$_2$), a silicon nitride (SiN$_x$), a silicon oxynitride (SiON), an aluminum oxide (Al$_2$O$_3$), a titanium oxide (TiO$_2$), a tantalum oxide (Ta$_2$O$_5$), a hafnium oxide (HfO$_2$), a zirconium oxide (ZrO$_2$), a barium strontium titanate ("BST"), a lead zirconate titanate ("PZT"), or a combination thereof, for example. In such an embodiment, the organic insulating layer may include a general-use polymer (e.g., polymethylmethacrylate ("PMMA") or polystyrene ("PS")), a polymer derivative having a phenol group, an acryl group polymer, an imide group polymer, an aryl ether group polymer, an amide group polymer, a fluorine group polymer, a p-xylene group polymer, a vinyl alcohol group polymer, or a combination thereof, for example. The protective layer 223 may be deposited by various vapor deposition methods, such as a plasma enhanced chemical vapor deposition ("PECVD") method, an atmospheric pressure chemical vapor deposition ("APCVD") method, a low pressure chemical vapor deposition ("LPCVD") method, and the like.

The third inorganic layer 16c is disposed on the organic light-emitting device OLED as described above to effectively prevent the infiltration of external oxygen and humidity into the organic light-emitting device OLED. In an exemplary embodiment, the third inorganic layer 16c has a lower LVT temperature than the first inorganic layer 16a, and the denaturalization of the organic light-emitting device OLED may be thereby substantially minimized when the organic light-emitting display apparatus 10 is sealed.

As described herein, according to one or more exemplary embodiments of the invention, a method of manufacturing an organic light-emitting display apparatus may include a process of adding a fluorine component to an LVT inorganic material in a process of sealing up an organic light emission part without producing a separate sputtering target. Accordingly, processes may be substantially simplified.

In such embodiments, the organic light emission part may be sealed with an LVT inorganic material having a low viscosity transition temperature, such that the denaturalization of the organic light emission part may be effectively minimized.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more exemplary embodiments of the invention have been described with reference to the figures, it will be understood by those of ordinary skill in the art that various changes in form and details may be made therein without departing from the spirit and scope of the invention as defined by the following claims.

What is claimed is:

1. A method of manufacturing an organic light-emitting display apparatus, the method comprising:
   providing an organic light emission part on a substrate;
   providing a first inorganic layer comprising a first low temperature viscosity transition inorganic material on the substrate to cover the organic light emission part; and
   adding fluoride into the first inorganic layer using a fluorine group material such that the first inorganic layer is converted into a second inorganic layer comprising a second low temperature viscosity transition inorganic material.

2. The method of claim 1, wherein the adding fluoride into the first inorganic layer comprises using a plasma processing process.

3. The method of claim 1, wherein the adding fluoride into the first inorganic layer comprises using an ion injection process.

4. The method of claim 1, wherein the fluorine group material comprises sulfur fluoride ($SF_6$), carbon fluoride ($CF_4$), or a combination thereof.

5. The method of claim 1, wherein the first low temperature viscosity transition inorganic material comprises a tin oxide.

6. The method of claim 1, wherein
   the first low temperature viscosity transition inorganic material comprises a tin oxide (SnO), and further comprises a phosphorous oxide ($P_2O_5$), a boron phosphate ($BPO_4$), a niobium oxide (NbO), a zinc oxide (ZnO), a titanium oxide ($TiO_2$), a tungsten oxide ($W_3O$), or a combination thereof.

7. The method of claim 1, wherein a viscosity transition temperature of the second low temperature viscosity transition inorganic material is lower than a viscosity transition temperature of the first low temperature viscosity transition inorganic material.

8. The method of claim 1, wherein the first inorganic layer comprises tin phosphate glass ($SnO$—$P_2O_5$).

9. The method of claim 1, wherein the second inorganic layer further comprises tin fluoride phosphate glass ($SnO$—$P_2O_5$—$SnF_2$).

10. The method of claim 1, wherein the substrate is a flexible substrate.

11. A method of manufacturing an organic light-emitting display apparatus, the method comprising:
    providing an organic light emission part on a substrate;
    providing a first inorganic layer comprising a first low temperature viscosity transition inorganic material on the substrate to cover the organic light emission part;
    adding fluoride into the first inorganic layer using a fluorine group material such that the first inorganic layer is converted into a second inorganic layer comprising a second low temperature viscosity transition inorganic material; and
    performing a healing operation on the second inorganic layer by heat-treating the second inorganic layer at a predetermined temperature equal to or higher than a viscosity transition temperature of the second low temperature viscosity transition inorganic material such that the second inorganic layer is converted into a third inorganic layer.

12. The method of claim 11, wherein the second low temperature viscosity transition inorganic material is formed by doping fluoride into the first low temperature viscosity transition inorganic material or substituting a portion of the first low temperature viscosity transition inorganic material with fluoride.

13. The method of claim 11, wherein the predetermined temperature is lower than a denaturalization temperature of a material of the organic light emission part.

14. The method of claim 11, wherein the healing operation is performed under a vacuum atmosphere or an inert gas atmosphere.

15. The method of claim 11, wherein the first low temperature viscosity transition inorganic material comprises tin phosphate glass ($SnO$—$P_2O_5$).

16. The method of claim 11, wherein the third inorganic layer comprises tin fluoride phosphate glass ($SnO$—$P_2O_5$—$SnF_2$).

17. The method of claim 11, wherein the adding fluoride into the first inorganic layer comprises using a plasma processing process.

18. The method of claim 11, wherein the viscosity transition temperature of the second low temperature viscosity transition inorganic material is lower than a viscosity transition temperature of the first low temperature viscosity transition inorganic material.

19. The method of claim 11, wherein the viscosity transition temperature of the second low temperature viscosity transition inorganic material is lower than a denaturalization temperature of a material of the organic light emission part.

20. The method of claim 11, wherein
    the organic light emission part comprises a plurality of organic light-emitting devices,
    wherein each of the organic light-emitting devices comprises a first electrode, a second electrode, and an organic light emission layer disposed between the first electrode and the second electrode.

* * * * *